United States Patent
Omoto et al.

(10) Patent No.: US 7,635,646 B2
(45) Date of Patent: Dec. 22, 2009

(54) METHOD FOR FABRICATING SEMICONDUCTOR DEVICE

(75) Inventors: Seiichi Omoto, Mie (JP); Hisashi Kaneko, Kanagawa (JP); Masahiko Hasunuma, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 12/128,789

(22) Filed: May 29, 2008

(65) Prior Publication Data

US 2008/0299766 A1 Dec. 4, 2008

(30) Foreign Application Priority Data

May 31, 2007 (JP) .............................. 2007-145516

(51) Int. Cl.
*H01L 21/44* (2006.01)

(52) U.S. Cl. ............... 438/654; 438/677; 257/E21.548; 257/E21.582; 257/E21.479

(58) Field of Classification Search ................. 438/677, 438/654; 257/E21.582, E21.584, E21.588, 257/E21.479, E21.586

See application file for complete search history.

(56) References Cited

U.S. PATENT DOCUMENTS

| 6,921,712 | B2 | 7/2005 | Soininen et al. |
| 7,276,796 | B1 | 10/2007 | Yang et al. |
| 2007/0252282 | A1 | 11/2007 | Anderson et al. |
| 2008/0153252 | A1* | 6/2008 | Liu et al. ............... 438/421 |
| 2009/0081862 | A1* | 3/2009 | Chen et al. ............ 438/618 |

FOREIGN PATENT DOCUMENTS

JP          2003-163266          6/2003

OTHER PUBLICATIONS

Translation of JP 2003-163266, H. Kawashima, (Jun. 6, 2003).*

* cited by examiner

*Primary Examiner*—Caridad M Everhart
(74) *Attorney, Agent, or Firm*—Finnegan, Henderson, Farabow, Garrett & Dunner, L.L.P.

(57) ABSTRACT

A method for fabricating a semiconductor device, includes forming a first dielectric film above a substrate, forming an opening in the first dielectric film, forming a catalytic characteristic film using at least one of a metal having catalytic characteristics and a conductive oxide having catalytic characteristics as its material on sidewalls and at a bottom of the opening, depositing a conductive material film using a conductive material in the opening in which the catalytic characteristic film is formed on the sidewalls and at the bottom, removing the catalytic characteristic film formed on the sidewalls of the opening, and forming a second dielectric film above the first dielectric film and the conductive material film after the removing.

20 Claims, 10 Drawing Sheets

METHOD FOR FABRICATING SEMICONDUCTOR DEVICE

CROSS-REFERENCE TO RELATED APPLICATION

This application is based upon and claims the benefit of priority from prior Japanese Patent Application No. 2007-145516 filed on May 31, 2007 in Japan, the entire contents of which are incorporated herein by reference.

BACKGROUND OF THE INVENTION

1. Field of the Invention

The invention relates to a method for fabricating a semiconductor device and, for example, relates to a manufacturing method of a semiconductor device for forming a fine wire.

2. Related Art

In recent years, with ever higher degrees of integration and higher performance of semiconductor integrated circuits (LSI), new microprocessing technologies have been developed. In particular, to achieve an ever faster speed of LSI, there has been a growing trend recently to replace the conventional wire material of aluminum (Al) alloys with copper (Cu) or Cu alloys (hereinafter, called Cu together) having lower resistance. Since it is difficult to apply the dry etching method, which is frequently used for forming an Al alloy wire, to Cu for microprocessing, the so-called damascene process is mainly adopted for Cu, in which a Cu film is deposited onto a dielectric film to which groove processing has been provided and then the Cu film is removed except in portions where the Cu film is embedded in a groove by chemical-mechanical polishing (CMP) to form an embedded wire. The Cu film is generally formed, after forming a thin seed layer by a sputter processor the like, into a laminated film having a thickness of several hundred nanometers by the electro-plating method.

Recently, the use of a low dielectric constant film (low-k film) having a low relative dielectric constant as an inter-level dielectric is studied. That is, an attempt is made to reduce parasitic capacitance between wires by using a low dielectric constant film (low-k film) whose relative dielectric constant k is 3 or less, instead of silicon oxide (SiO2) whose relative dielectric constant k is about 4.2. Then, a barrier metal film of titanium nitride (TiN) or the like is first formed on a sidewall or at a bottom of a groove and then Cu is embedded to prevent diffusion of Cu into the low-k film.

To further reduce parasitic capacitance between wires, a technology to form an air gap and the like has also been attempted. For example, a sidewall layer made of amorphous carbon fluorine is first formed on sidewalls of a wire groove. Then, after forming a barrier metal film and a Cu film, the sidewall layer is removed to form an air gap (See, for example, Japanese Unexamined Patent Application Publication No. 2003-163266).

Though reduced parasitic capacitance between wires and lower resistance of wires have been promoted, as described above, it is becoming increasingly difficult to embed Cu in a groove with ever narrower width of the groove. Currently, Cu can be embedded in a groove by the damascene process up to the wiring width of about 50 nm at an applicable level of mass production. However, with ever higher degrees of integration and higher performance of LSI, development of a still finer wire is demanded. Thus, development of a technology to embedded Cu in a still narrower wiring groove is urgently necessary. Such a technology to improve embedding properties of Cu has not been developed.

BRIEF SUMMARY OF THE INVENTION

A method for fabricating a semiconductor device in an aspect of the invention, including: forming a first dielectric film above a substrate; forming an opening in the first dielectric film; forming a catalytic characteristic film using at least one of a metal having catalytic characteristics and a conductive oxide having catalytic characteristics as its material on sidewalls and at a bottom of the opening; depositing a conductive material film using a conductive material in the opening in which the catalytic characteristic film is formed on the sidewalls and at the bottom; removing the catalytic characteristic film formed on the sidewalls of the opening; and forming a second dielectric film above the first dielectric film and the conductive material film after the removing.

A method for fabricating a semiconductor device in another aspect of the invention, including: forming a diffusion prevention film above a substrate; forming a first dielectric film above the diffusion prevention film; forming an opening in the first dielectric film; forming a catalytic characteristic film using at least one of a metal having catalytic characteristics and a conductive oxide having catalytic characteristics as its material on sidewalls and at a bottom of the opening; depositing a conductive material film using a conductive material in the opening in which the catalytic characteristic film is formed on the sidewalls and at the bottom; removing the catalytic characteristic film formed on the sidewalls of the opening; and forming a second dielectric film above the first dielectric film and the conductive material film after the removing.

DETAILED DESCRIPTION OF THE INVENTION

First Embodiment

In the first embodiment, a configuration in which Cu is embedded using a metallic material or conductive oxide material having wettability higher than that of barrier metal materials used commonly and catalytic characteristics as a foundation layer, the metallic material or conductive oxide material on sidewalls of Cu is removed to thinly form a diffusion prevention film on the sidewalls and an upper surface of Cu, and a dielectric film is caused to deposit in a remaining space will be described. The first embodiment will be described below using drawings.

Figure 1:
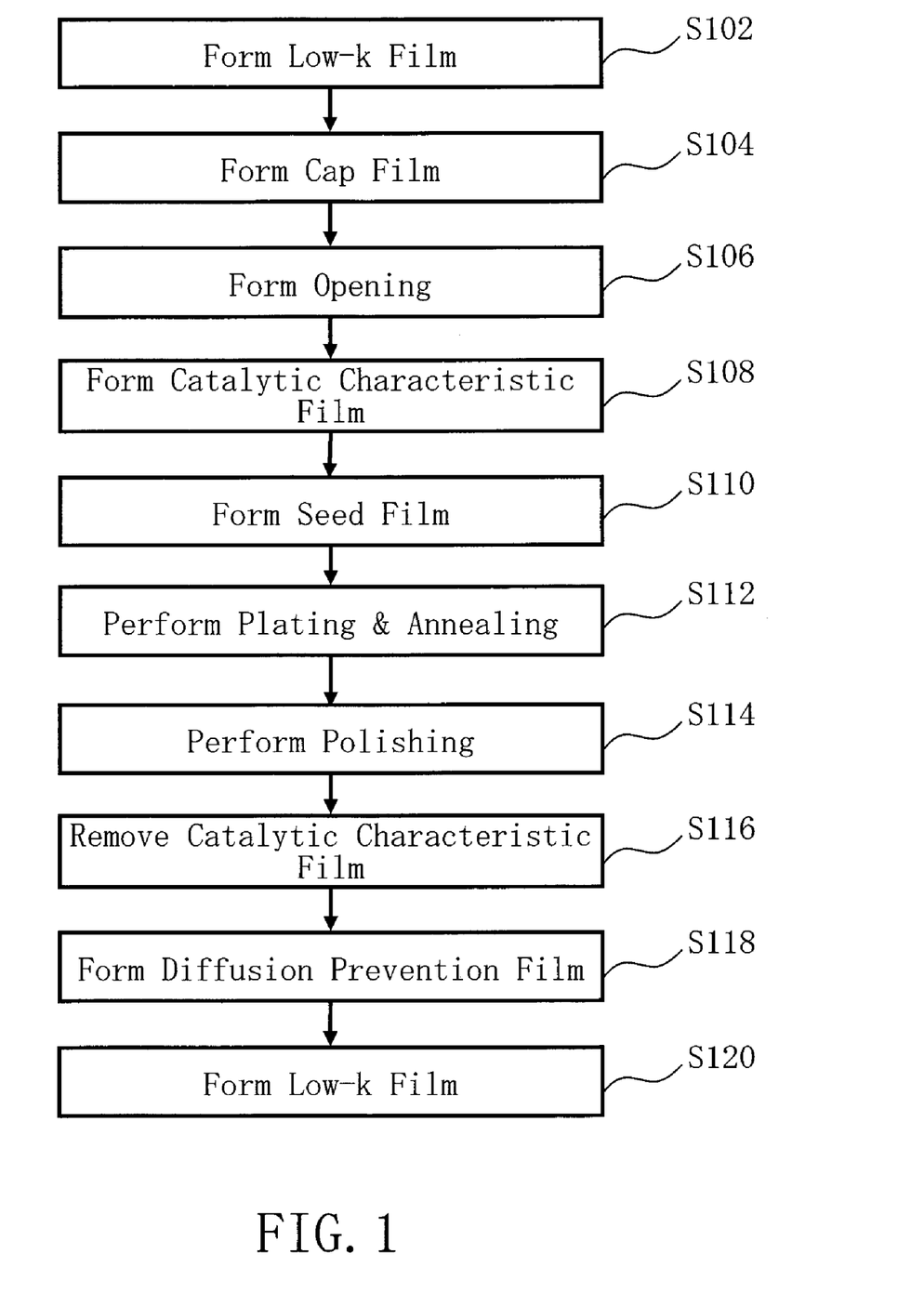
FIG. 1 is a flow chart showing principal parts of a manufacturing method of a semiconductor device in a first embodiment.

FIG. 1 is a flow chart showing principal parts of a manufacturing method of a semiconductor device in the first embodiment. In FIG. 1, the manufacturing method of a semiconductor device in the first embodiment performs a series of processes including a low-k film formation process (S102), a cap film formation process (S104), an opening formation process (S106), a catalytic characteristic film formation process (S108), a seed film formation process (S110), a plating and annealing process (S112), a polishing process (S114), a catalytic characteristic film removal process (S116), a diffusion prevention film formation process (S118), and a low-k film formation process (S120).

FIG. 2A to FIG. 2D are process sectional views showing processes performed corresponding to the flow chart in FIG. 1. FIG. 2A to FIG. 2D show the low-k film formation process (S102) to the catalytic characteristic film formation process (S108) in FIG. 1.

Figure 2A:
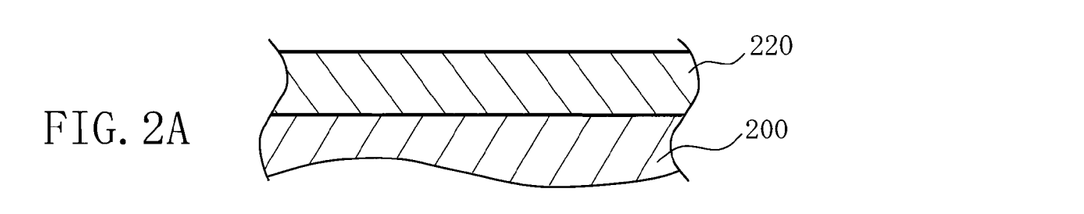
FIG. 2A to FIG. 2D are process sectional views showing processes performed corresponding to the flow chart in FIG. 1.

In FIG. 2A, as the low-k film formation process (S102), a thin film of a low-k film 220 using a porous low dielectric constant material is formed above, or "on" a substrate 200 to a thickness of, for example, 200 nm. By forming such a dielectric film, an inter-level dielectric whose relative dielectric constant k is lower than 3.5 can be obtained. Here, as an example, the low-k film 220 is formed by applying LKD (Low-K Dielectric material, manufactured by JSR) using polymethylsiloxane to be a low dielectric constant material whose relative dielectric constant k is lower than 2.5. The low-k film 220 may be formed using at least one material selected from a group consisting of, in addition to polymethylsiloxane, for example, a film having siloxane backbone structures such as polysiloxane, hydrogen silsesquioxane, and methylsilsesquioxane, an organic film having organic resin as a main component such as polyarylene ether (PAr), polybenzoxazole, and polybenzocyclobutene, and a porous film such as porous silica film. Using such materials of the low-k film 220, a low dielectric constant whose relative dielectric constant is less than 2.5 can be obtained. For example, the SOD (spin on dielectric coating) method by which a thin film is formed by spin-coating and heat-treating a solution and the chemical vapor deposition (CVD) method may be used as a formation method thereof. A silicon wafer of 300 mm in diameter, for example, may be used as the substrate 200. Here, an illustration of a device portion is omitted. Moreover, a layer having various semiconductor devices or structures (not shown) such as metallic wire or contact plug may be formed above, or "on" the substrate 200. Or, any other layer may be formed.

Figure 2B:
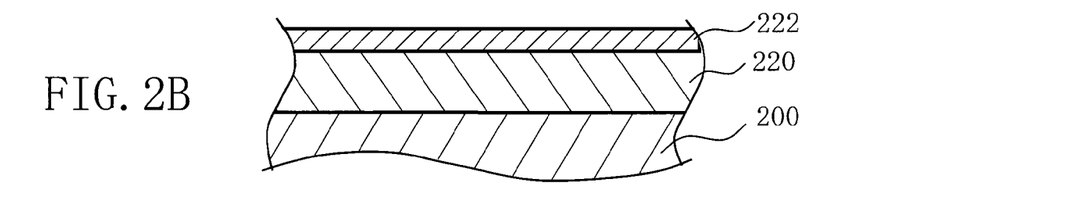

In FIG. 2B, as the cap film formation process (S104), a thin film of a SiOC film 222 is formed by depositing, for example, SiOC to be a cap dielectric film onto the low-k film 220 by the CVD method to a thickness of, for example, 200 nm. By forming the SiOC film 222, the low-k film 220 whose mechanical strength is weak can be protected from a load of chemical-mechanical polishing (CMP) when a wire material is embedded by the damascene method. The cap dielectric film may be formed using at least one dielectric material whose relative dielectric constant is 2.5 or more selected from a group consisting of, in addition to SiOC, TEOS (tetraethoxysilane), SiC, silicon carbohydrate (SiCH), silicon carbonitride (SiCN), SiOCH, and silane (SiH4). Here, though the dielectric film is formed by the CVD method, a different method such as the SOD method may also be used.

Figure 2C:
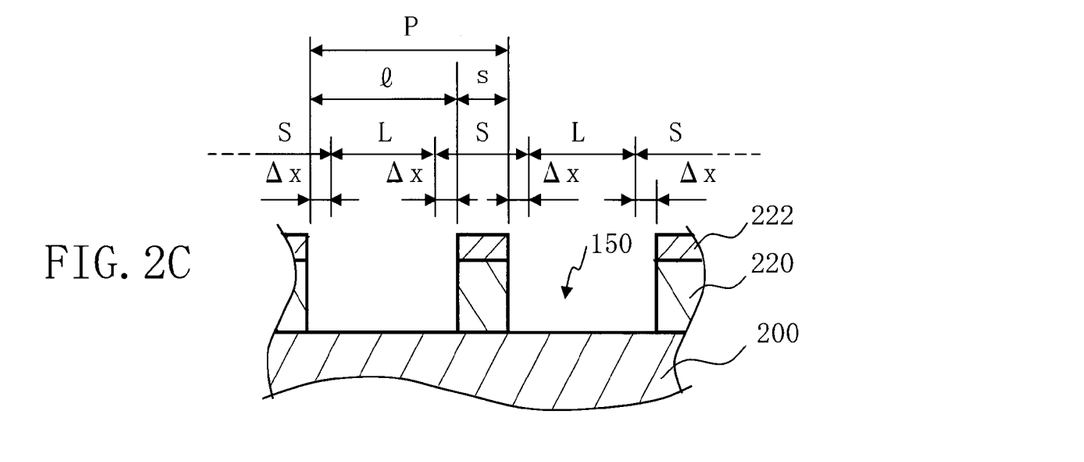

In FIG. 2C, as the opening formation process (S106), an opening 150, which is a wire groove structure for making a damascene wire in lithography and dry etching processes is formed inside the SiOC film 222 and the low-k film 220. The opening 150 can be formed substantially perpendicular to the surface of the substrate 200 by removing the exposed SiOC film 222 and the low-k film 220 positioned thereunder by the anisotropic etching method with respect to the substrate 200 having a resist film on the SiOC film 222 formed through the lithography process such as a resist application process and an exposure process (not shown). For example, the opening 150 may be formed by the reactive ion etching method. Here, an example in which a line width L and space width S are formed in such a way that they will eventually be 1:1 is shown. In that case, the opening 150 is formed in such a way that a width l of the opening 150 has a dimension broadened by $\Delta x$ on both sides from the line width L without changing the pitch. That is, the opening 150 is formed in such a way that the space portion is narrower by $\Delta x$ on both sides. If, for example, a line and space pattern of 40 nm each with a pitch P=80 nm should eventually be formed, an opening is formed with the width l of, for example, 60 nm while maintaining the pitch P=80 nm. However, the line & space pattern is not limited to 1:1 and any other ratio may also be used. For example, like when forming a wire of 70 nm in the past, an opening may be formed with the pitch P=140 nm and the width l=70 nm. Even in this case, a wire whose width is narrower than 50 nm, in which case embedding is hard to perform, for example, a wire of 30 nm can ultimately be formed. The width l and the pitch of the opening 150 may be set eventually in accordance with the desired Cu wire width L and space width S and the thickness of a catalytic characteristic film described later.

Figure 2D:
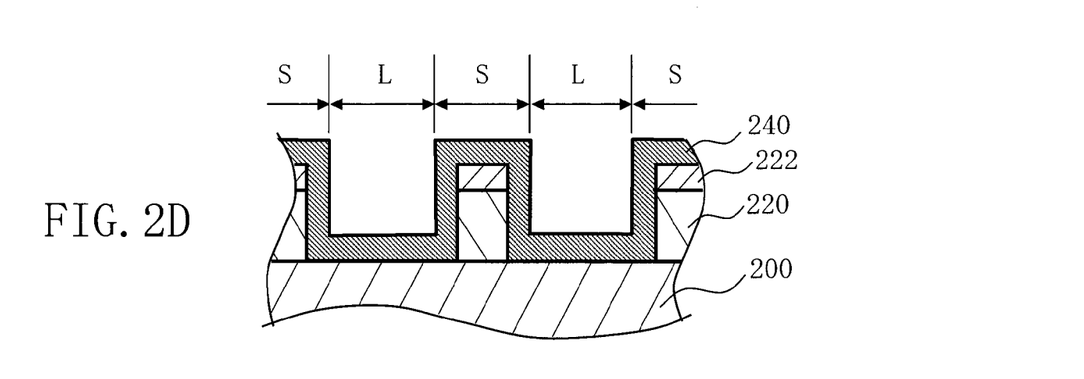

In FIG. 2D, as the catalytic characteristic film formation process (S108), a catalytic characteristic film 240 using a material of ruthenium (Ru) having catalytic characteristics is formed on sidewalls and at a bottom of the opening 150 formed by the opening formation process and on the surface of the SiOC film 222. The atomic layer deposition (ALD) method is used to form the catalytic characteristic film 240 to a thickness of 10 nm on the sidewalls and at the bottom of the opening 150 and on the surface of the SiOC film 222. By using the ALD method, the film formed on the sidewalls and at the bottom of the opening 150 and on the surface of the SiOC film 222 can be formed uniformly. The formation method is not limited to the ALD method and the atomic layer chemical vapor deposition (ALCVD) method or the CVD method can also be suitably used. Or, the sputter process, which is one of the physical vapor deposition (PVD) method, may be used, though inferior in uniformity of the film. A metal having catalytic characteristics or a conductive oxide having catalytic characteristics is suitably used as a material of the catalytic characteristic film 240. As a metal having catalytic characteristics, for example, in addition to Ru, rhodium (Rh), palladium (Pd), platinum (Pt), Iridium (Ir), zinc (Zn), nickel (Ni), cobalt (Co), or alloys containing at least one of these elements can be used. As a conductive oxide, ruthenium oxide (RuO), indium oxide (InO), rhodium oxide (RhO), zinc oxide (ZnO), tin oxide (SnO), titanium oxide (TiO), nickel oxide (NiO), cobalt oxide (CoO), or double oxide containing these can be used. By using these materials, a film whose wettability is higher than that of a film using tantalum (Ta), a tantalum containing material such as tantalum nitride (TaN), titanium (Ti), a titanium containing material such as titanium nitride (TiN), or nitride of tungsten (W) such as tungsten nitride (WN), or Ta and TaN in combination or the like commonly used as barrier metal materials. In a manner described above, a wetting layer with high wettability can be formed on the sidewalls and at the bottom of the opening 150.

Or, an alloy of a metal having catalytic characteristics such as Ru and a metal with higher barrier property of Cu such as Ta, Ti, and W may also be suitably used as a material of the catalytic characteristic film 240. By using an alloy of material commonly used as a barrier metal material such as Ta, Ti, and W, and Ru or the like having catalytic characteristics, barrier property preventing diffusion of Cu to the substrate 200 can be improved while maintaining catalytic characteristics.

Here, for example, if a Cu wire of 30 nm should ultimately be formed by forming an opening of the width l=70 nm, as described above, the catalytic characteristic film 240 may be formed on the sidewalls and at the bottom of the opening 150 and on the surface of the SiOC film 222 to a thickness of 20 nm.

Figure 3A:
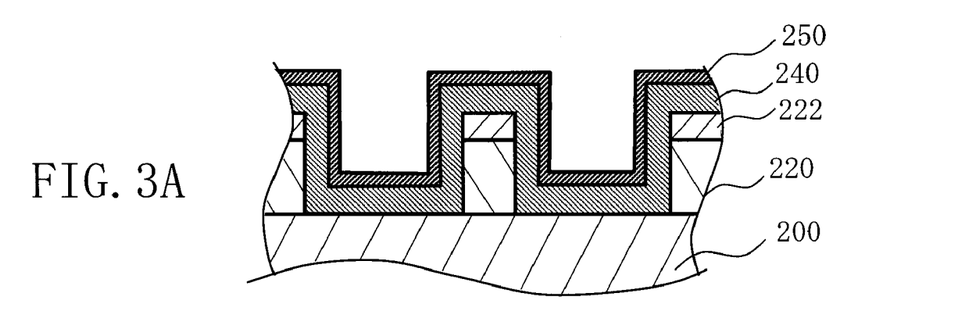
FIG. 3A to FIG. 3C are process sectional views showing processes performed corresponding to the flow chart in FIG. 1.
Figure 3B:
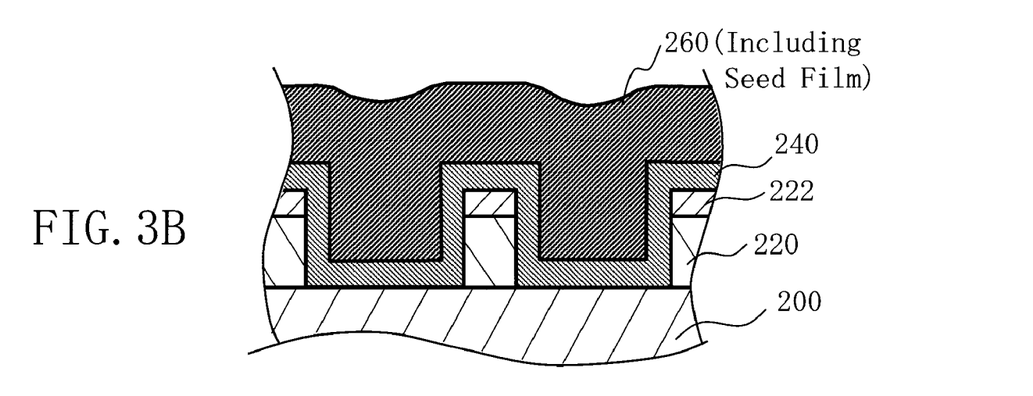
Figure 3C:
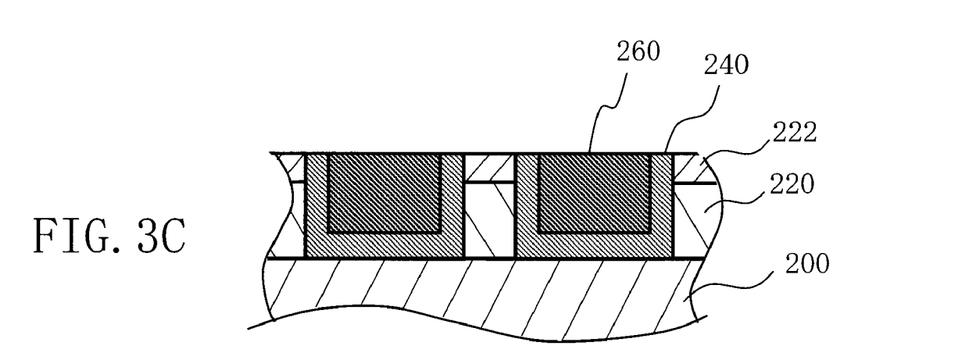

FIG. 3A to FIG. 3C are process sectional views showing processes performed corresponding to the flow chart in FIG. 1. FIG. 3A to FIG. 3C show the seed film formation process (S110) to the polishing process (S114) in FIG. 1.

In FIG. 3A, as the seed film formation process (S110), a Cu thin film to be a cathode electrode in the next electro-plating process is caused to deposit (form) on the inner walls and at the bottom of the opening 150 and on the surface of the substrate 200 where the catalytic characteristic film 240 is formed as a seed film 250 by the PVD method such as sputtering. In contrast to a conventional barrier metal material, the catalytic characteristic film 240 has high wettability, which allows the seed film 250 not to be cut.

In FIG. 3B, as the plating and annealing process (S112), with the seed film 250 as the cathode electrode, a Cu film 260 to be a conductive material is caused to deposit inside the opening and on the surface of the substrate 200 by the electrochemical deposition method such as electro-plating. Here, the Cu film 260 of thickness of, for example, 800 nm is caused to deposit and after the deposition, annealing treatment is provided, for example, at 250° C. for one hour.

Here, in contrast to a conventional barrier metal material, the catalytic characteristic film 240 has high wettability and thus, the seed film 250 is formed on the sidewalls and at the bottom of the opening without any rift. Further, the catalytic characteristic film 240 has catalytic characteristics for plating and thus, embedding defects are less likely to be caused during plating even if the seed film 250 has some discontinuous portions so that the Cu film 260 can be embedded even for a narrower wire width than conventionally used. Here, the Cu film is embedded by electro-plating, but when the Cu film is formed by the CVD method, improvement of embedding properties to an opening during deposition of a Cu film by the CVD method can also be expected based on catalytic characteristics of the catalytic characteristic film 240.

In FIG. 3C, as the polishing process (S114), the surface of the substrate 200 is polished by the CMP method to remove by polishing the Cu film 260 including the seed film 250 to be a wiring layer and the catalytic characteristic film 240 deposited on the surface excluding the opening. As a result, as shown in FIG. 3C, the substrate 200 can be planarized. However, as it stands, the low-k film 220 is narrow in width and therefore, insulation properties between wires may be insufficient. Also, the catalytic characteristic film 240 may have a problem from the viewpoint of diffusion prevention of Cu. Thus, the metallic film is removed in a manner shown below.

Figure 4A:
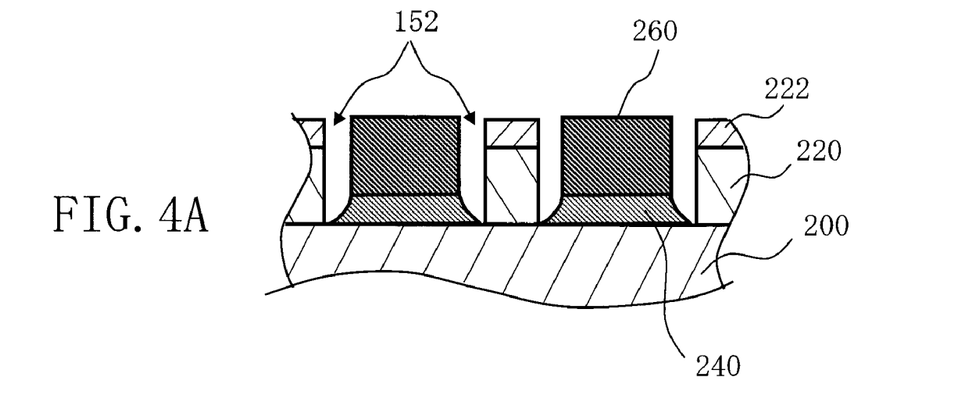
FIG. 4A to FIG. 4C are process sectional views showing processes performed corresponding to the flow chart in FIG. 1.
Figure 4B:
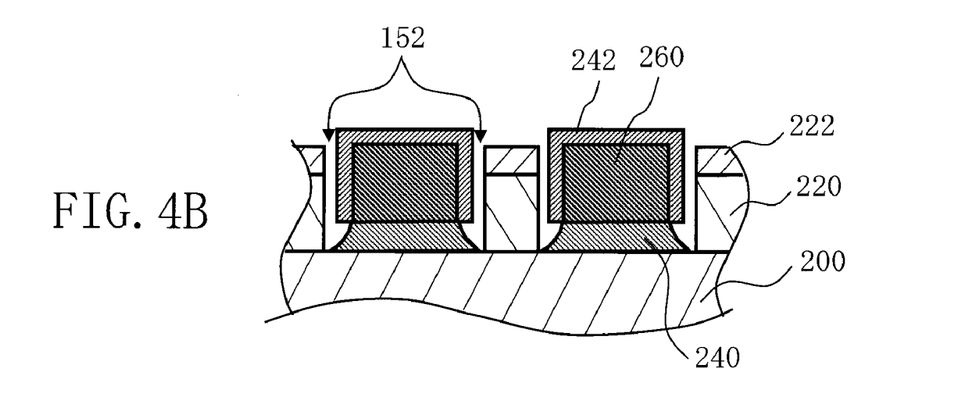
Figure 4C:
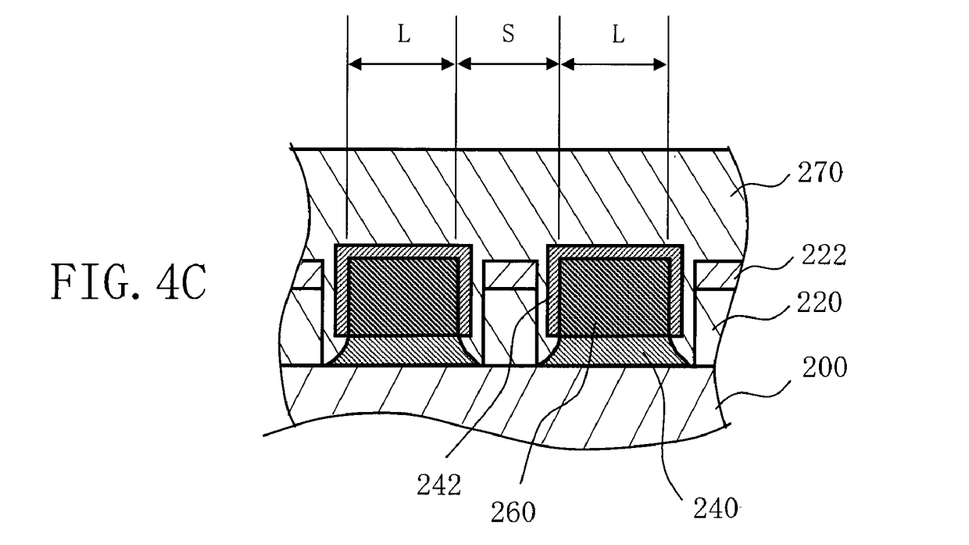

FIG. 4A to FIG. 4C are process sectional views showing processes performed corresponding to the flow chart in FIG. 1. FIG. 4A to FIG. 4C show the catalytic characteristic film removal process (S116) to the low-k film formation process (S120) in FIG. 1.

In FIG. 4A, as the catalytic characteristic film removal process (S116), the catalytic characteristic film 240 in contact with sidewalls of the Cu film 260 is removed by etching. For example, processing by the reactive ion etching method is performed using an F2 gas to remove the ALD-Ru film on the Cu sidewalls. An opening 152 to be a space is thereby formed.

In FIG. 4B, as the diffusion prevention film formation process (S118), a diffusion prevention film 242 is selectively formed on the sidewalls and upper surface of the exposed Cu film 260. Here, a compound film of Cu, silicon (Si), and nitrogen (N) is formed as the diffusion prevention film 242. The diffusion prevention film 242 can be formed by feeding a silane (SiH4) gas and an ammonia (NH3) gas into a reaction vessel where the substrate 200 is arranged to selectively perform reforming processing of the surface of the Cu film 260. More specifically, after forming a Cu wire, an oxide on the surface of the Cu film 260 is removed by reductive plasma and then, the surface of the Cu film 260 is exposed by an SiH4 gas to cause Si to diffuse among Cu. Subsequently, extra Si is removed by plasma containing N, which is an element of the NH3 gas, to form Si—N bonding on the surface of the Cu film 260. For example, the diffusion prevention film 242 is formed to a thickness thinner than that of the catalytic characteristic film 240. The diffusion prevention film 242 is formed to a thickness of, for example, 5 nm. By forming the diffusion prevention film 242, diffusion of Cu into the dielectric film can be prevented.

In FIG. 4C, as the low-k film formation process (S120), a low-k film 270 is formed using the coating method on the Cu film 260 whose upper surface and sidewalls are covered with the diffusion prevention film 242, on the SiOC film 222, and in the space after the catalytic characteristic film 240 being removed. A siloxane-based low dielectric constant film or a polyarylene-based low dielectric constant film is suitably used as a material of the low-k film 270. In this manner, a damascene wire of Cu can be formed. With the low-k film 270 being formed in the opening 152 after the catalytic characteristic film 240 being removed, the width of the dielectric film can be made wider than when the opening 150 is formed. Thus, insulation properties between wires can be enhanced. Further, hillocks can be suppressed by eliminating space. In the manner described above, a Cu wire of 40 nm in which the ratio of the wire width L and the space width S becomes 1:1 can be formed. The material of the low-k film 270 may be the same as that of the low-k film 220. By using the low-k film 270, parasitic capacitance can be reduced.

Here, if the catalytic characteristic film 240 is formed to a thickness of 20 nm by forming the opening 150 having the width l=70 nm, as described above, a Cu wire of 30 nm can ultimately be formed. Thus, a Cu wire narrower than 50 nm, which is the wire width that can conventionally be mass-produced, can be formed, as described above, even if the opening 150 is formed wider than 50 nm, which is the wire width that can conventionally be mass-produced. Moreover, since the width of Cu wire can be adjusted by the catalytic characteristic film 240, a Cu wire narrower than in the past can be formed even without improvement of the lithography and etching technologies used for forming a conventional opening.

Second Embodiment

In the first embodiment, a configuration in which the diffusion prevention film 242 of CuSiN is selectively formed on the sidewalls and upper surface of the exposed Cu film 260 as a diffusion prevention film is described. However, the invention is not limited to this. In the second embodiment, a configuration of forming a diffusion prevention film using other materials will be described. The flow chart of a manufacturing method is the same as shown in FIG. 1. Other processes than the diffusion prevention film formation process (S118) are the same as those in the first embodiment.

Figure 5A:
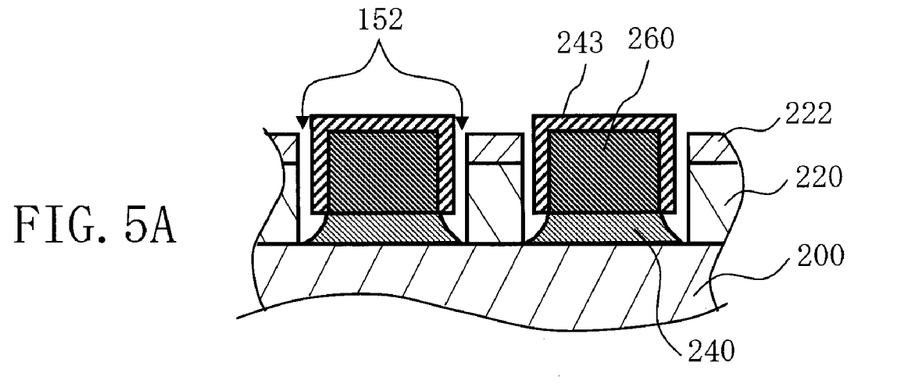
FIG. 5A and FIG. 5B are process sectional views showing processes performed corresponding to the flow chart in FIG. 1 in a second embodiment.
Figure 5B:
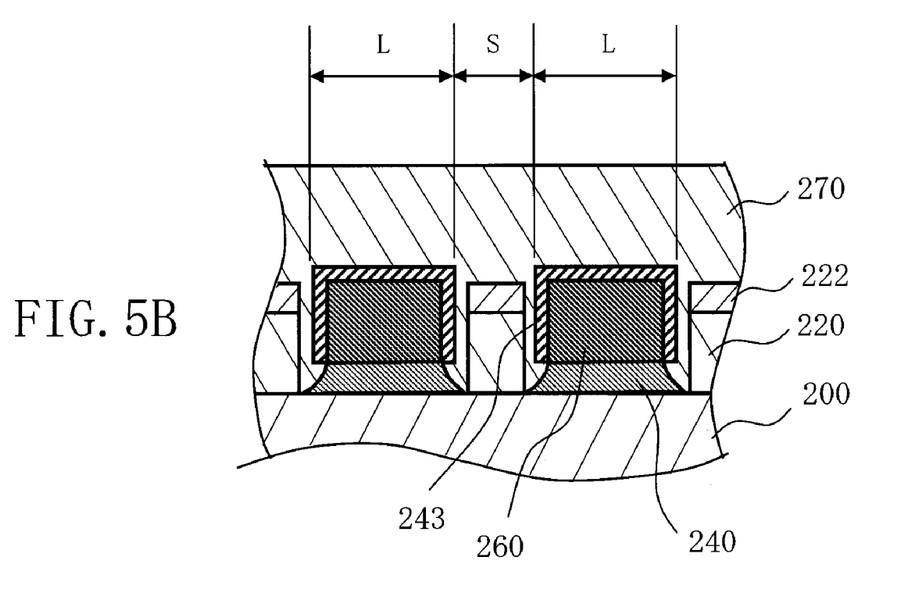

FIG. 5A and FIG. 5B are process sectional views showing processes performed corresponding to the flow chart in FIG. 1 in the second embodiment. FIG. 5A and FIG. 5B show the diffusion prevention film formation process (S118) to the low-k film formation process (S120) in FIG. 1.

In FIG. 5A, as the diffusion prevention film formation process (S118), a diffusion prevention film 243 is selectively formed on the sidewalls and upper surface of the exposed Cu film 260. Here, a Co alloy is formed on the surface of an exposed Cu wire as the diffusion prevention film 243 by using electroless plating. Cobalt-tungsten-boron (CoWB), for example, is suitable as the Co alloy. More specifically, after forming a Cu wire, an oxide on the surface of the Cu film 260 is removed by wet treatment with soaking in a chemical solution such as hydrochloric acid (HCl) and fluoric acid (HF) and then CoWB is formed on the surface of the Cu film 260 using dimethylamine boron by electroless plating. In addition to CoWB, cobalt-tungsten-phosphor (CoWP) or a Co alloy containing these may also be suitably used as a material of the diffusion prevention film 243. Also in the second embodiment, the diffusion prevention film 243 is formed to a thickness thinner than that of the catalytic characteristic film 240. The diffusion prevention film 243 is formed to a thickness of, for example, 5 nm. By forming the diffusion prevention film 243, diffusion of Cu into the dielectric film can be prevented.

To form a film of a conductive Co alloy as the diffusion prevention film 243 in the second embodiment, if the line width and space width should be formed to have the ratio of 1:1 like in the first embodiment, the width of the opening formed in the low-k film 220 may be made narrower or the thickness of the catalytic characteristic film 240 thicker so that the wire width obtained by adding the thickness of the diffusion prevention film 243 on both sides to the width of the Cu film 260 becomes half the pitch. Other processes are the same as those in the first embodiment. As a result, a Cu wire with the low-k film 270 formed as shown in FIG. 5B can be formed.

Further, instead of a Co alloy by electroless plating, Ta, TaN, Ti, TiN, WN and the like commonly used as a barrier metal material may also be used as the diffusion prevention film 243. More specifically, after forming the opening 152 by removing the catalytic characteristic film 240, a barrier metal material is caused to deposit onto the whole upper surface including the opening 152 by the PVD method, CVD method or the like and then, the surface is polished by the CMP method to remove the barrier metal material deposited on the upper surface excluding the opening 152. When a space left behind after the catalytic characteristic film 240 is removed is completely filled with the diffusion prevention film 243, like conventional technologies, the width of the opening 150 formed in the low-k film 220 becomes the wire width as it is. However, in the second embodiment, a wetting layer having high wettability is formed on the sidewalls and at the bottom of Cu when the opening is filled with Cu and thus, a Cu wire can be formed to a width thinner than 50 nm, which is the wire width that can conventionally be mass-produced.

Third Embodiment

The opening 152 created after the catalytic characteristic film 240 being removed is filled with a dielectric film in the first embodiment, but the invention is not limited to this.

Figure 6:
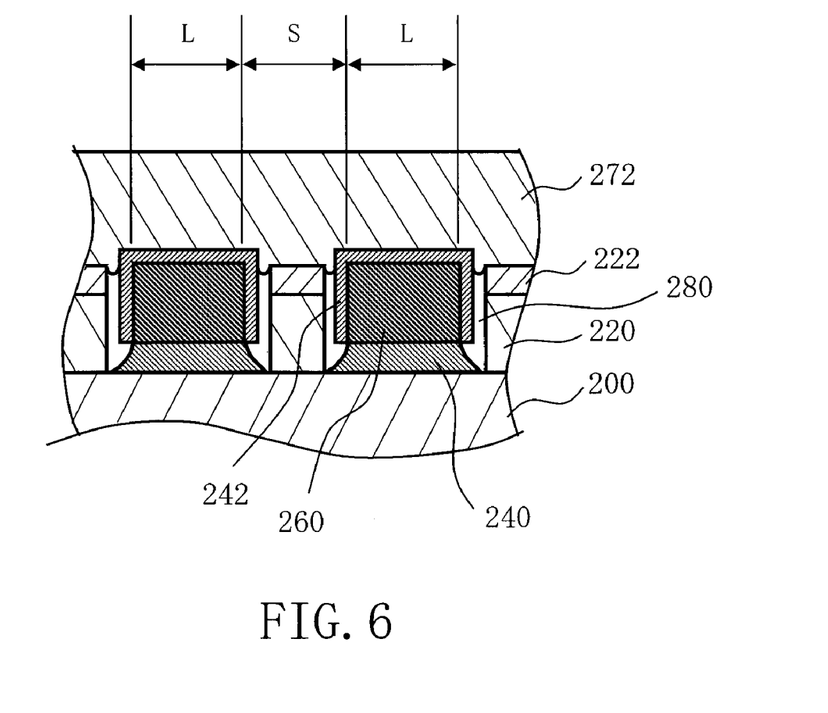
FIG. 6 is a process sectional view showing a process performed corresponding to the flow chart in FIG. 1 in a third embodiment.

FIG. 6 is a process sectional view showing a process performed corresponding to the flow chart in FIG. 1 in the third embodiment. FIG. 6 shows the low-k film formation process (S120) in FIG. 1. Processes hitherto are the same as those in the first embodiment. In the third embodiment, as the low-k film formation process, a low-k film 272 is formed on the Cu film 260 whose upper surface and sidewalls are covered with the diffusion prevention film 242 and on the SiOC film 222 by the CVD method. Here, the upper part of the space is plugged by purposely degrading coverage so that the opening 152 after the catalytic characteristic film 240 is removed is left behind as an air gap. With the low-k film 272 being formed by leaving behind a space on the side of sidewalls of the Cu film 260, as described above, an air gap 280 of the relative dielectric constant k=1 can be formed in an insulating region. Thus, parasitic capacitance between wires can be reduced. As a method of degrading coverage in the CVD method, for example, pressure during a process may be raised. SiOC, for example, is suitable as a material of the low-k film 272.

Fourth Embodiment

Except for an air gap left behind, the third embodiment is the same as the first embodiment. In the fourth embodiment, an aspect corresponding to the second embodiment will be described. That is, the fourth embodiment is the same as the third embodiment except that the diffusion prevention film 242 is replaced by a diffusion prevention film 243.

Figure 7:
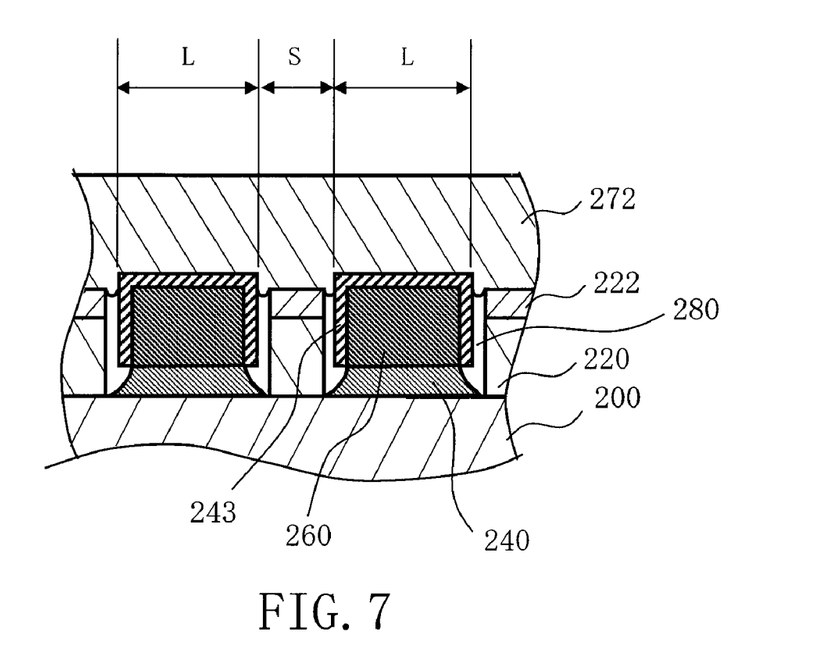
FIG. 7 is a process sectional view showing a process performed corresponding to the flow chart in FIG. 1 in a fourth embodiment.

FIG. 7 is a process sectional view showing a process performed corresponding to the flow chart in FIG. 1 in the fourth embodiment. FIG. 7 shows the low-k film formation process (S120) in FIG. 1. Processes hitherto are the same as those in the second embodiment. In the fourth embodiment, as the low-k film formation process, a low-k film 272 is formed on the Cu film 260 whose upper surface and sidewalls are covered with the diffusion prevention film 243 and on the SiOC film 222 by the CVD method. Here, the upper part of the space is plugged by purposely degrading coverage so that the opening 152 after the catalytic characteristic film 240 is removed is left behind as an air gap. With the low-k film 272 being formed by leaving behind a space on the side of sidewalls of the Cu film 260, as described above, the air gap 280 of the relative dielectric constant k=1 can be formed in an insulating region. Thus, parasitic capacitance between wires can be reduced.

Fifth Embodiment

The diffusion prevention film 242 or the diffusion prevention film 243 is formed on the upper surface and sidewalls of the Cu film 260 in the first to fourth embodiments, but the method of preventing diffusion of Cu is not limited to this.

Figure 8:
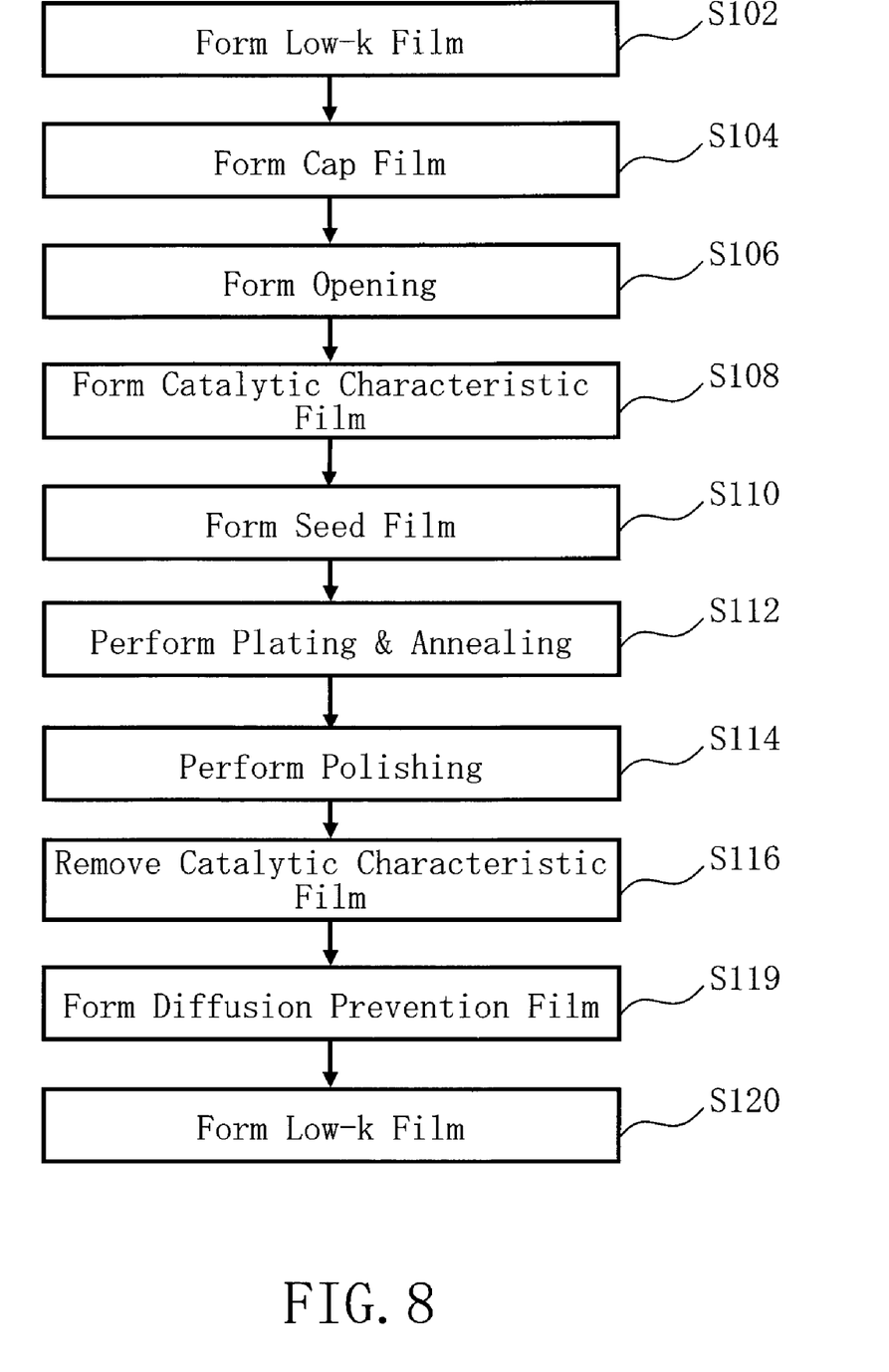
FIG. 8 is a flow chart showing principal parts of a manufacturing method of a semiconductor device in a fifth embodiment.

FIG. 8 is a flow chart showing principal parts of a manufacturing method of a semiconductor device in the fifth embodiment. FIG. 8 is the same as FIG. 1 except that instead of the diffusion prevention film formation process (S118), a diffusion prevention film formation process (S119) is used.

Figure 9A:
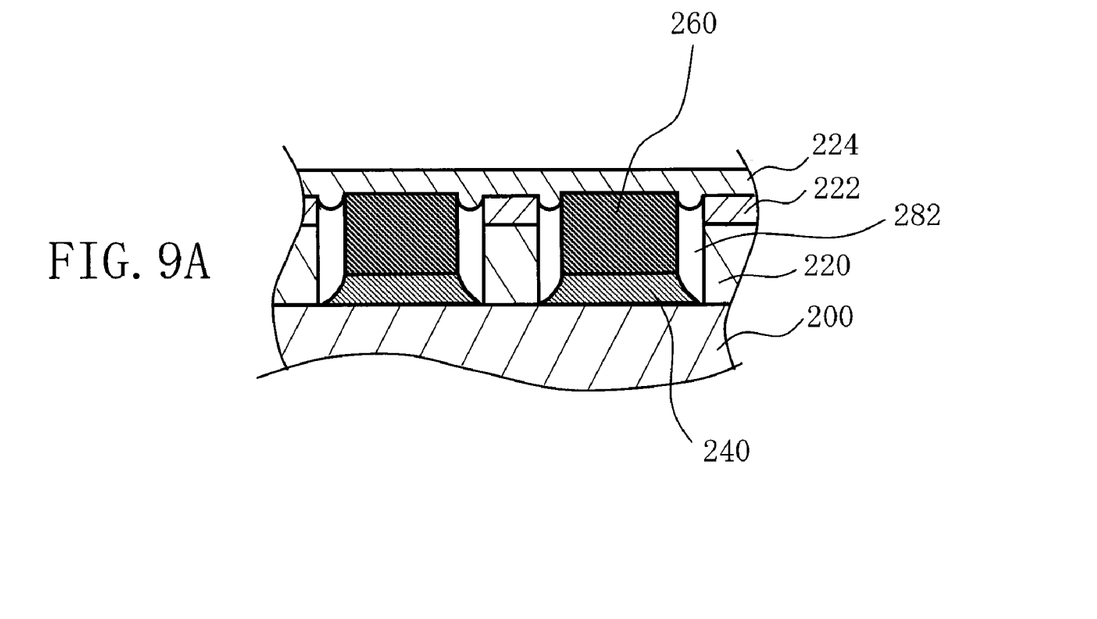
FIG. 9A and FIG. 9B are process sectional views showing processes performed corresponding to the flow chart in FIG. 8.
Figure 9B:
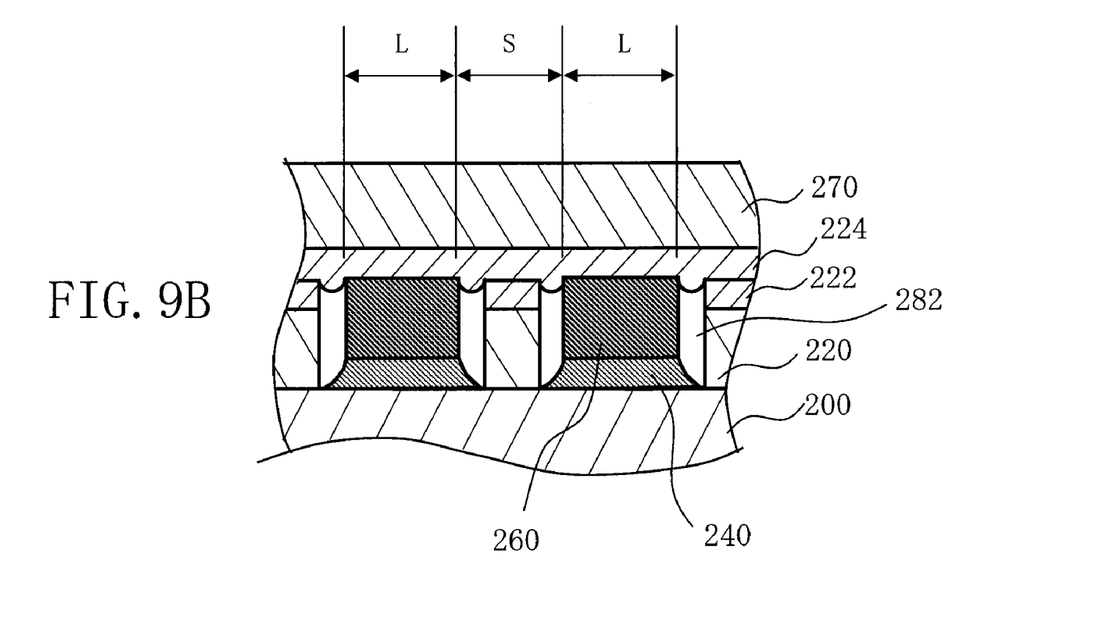

FIG. 9A and FIG. 9B are process sectional views showing processes performed corresponding to the flow chart in FIG. 8. FIG. 9A and FIG. 9B show the diffusion prevention film formation process (S119) to the low-k film formation process (S120) in FIG. 8. S102 to S116 are the same as those in the first to fourth embodiments.

In FIG. 9A, as the diffusion prevention film formation process (S119), a diffusion prevention film 224 is formed on the Cu film 260 and the SiOC film 222, instead of selectively forming a film on the exposed Cu film 260. As a material of the diffusion prevention film 224, for example, silicon carbide (SiC), silicon nitride (SiN), silicon carbonitride (SiCN), porous SiCN, or a laminated film of these may be used and it is desirable to form these as a thin film from the viewpoint of reducing parasitic capacitance between up and down wires. At this point, the upper part of the space is plugged by purposely degrading coverage so that the opening 152 after the catalytic characteristic film 240 is removed is left behind as an air gap. With the diffusion prevention film 224 being formed by leaving behind a space on the side of sidewalls of the Cu film 260, as described above, an air gap 282 of the relative dielectric constant k=1 can be formed in an insulating region. Thus, parasitic capacitance between wires can be reduced. As a method of degrading coverage in the CVD method, for example, pressure during a process may be raised.

In FIG. 9B, as the low-k film formation process (S120), the low-k film 270 is formed on the diffusion prevention film 224 using the coating method or CVD method. Since there is an air gap between the Cu film 260 and the low-k film 220, as described above, formation of a diffusion prevention film on the sidewalls of the Cu film 260 can be omitted. When forming a diffusion prevention film on the upper part of the Cu film 260, instead of selectively forming the diffusion prevention film, the whole upper surface may also be suitably covered with the diffusion prevention film 224. On the other hand, for example, like the first embodiment, a diffusion prevention film 244 may be formed on the whole upper surface after selectively forming the diffusion prevention film 242 on the surface of the exposed Cu film 260. Here, the low-k film 270 may be a coating film or CVD film because only an inter-level dielectric is formed on the diffusion prevention film 224.

Six Embodiment

In the first to fifth embodiments, the configuration to enhance barrier properties of the upper surface and sidewalls of the Cu film 260 by the diffusion prevention films 242, 243, and 244 is described. In the sixth embodiment, the configuration to enhance barrier properties of the bottom of the Cu film 260 will be described.

Figure 10:
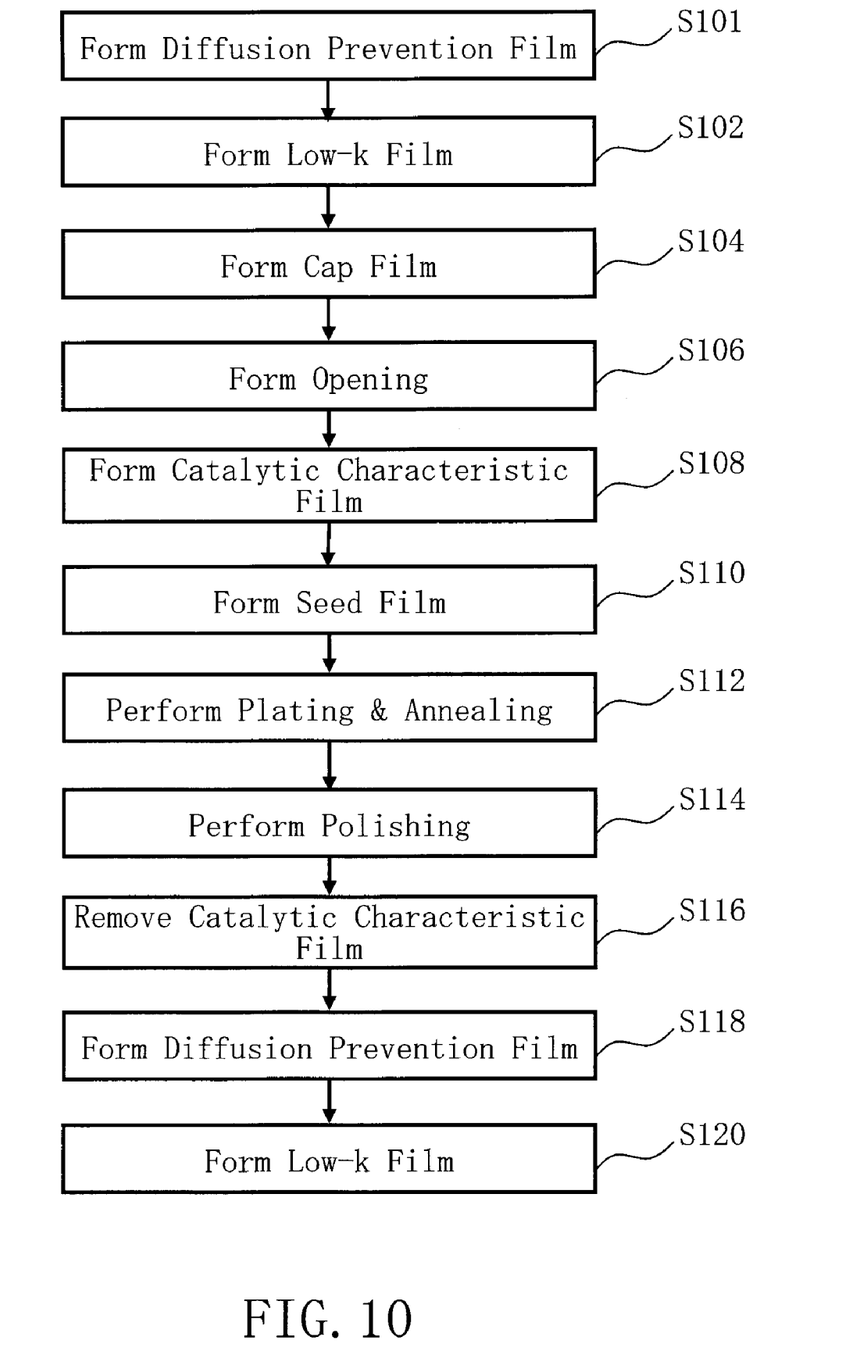
FIG. 10 is a flow chart showing principal parts of a manufacturing method of a semiconductor device in a sixth embodiment.

FIG. 10 is a flow chart showing principal parts of a manufacturing method of a semiconductor device in the sixth embodiment. FIG. 10 is the same as FIG. 1 except that a diffusion prevention film formation process (S101) is added before the low-k film formation process (S102).

Figure 11A:
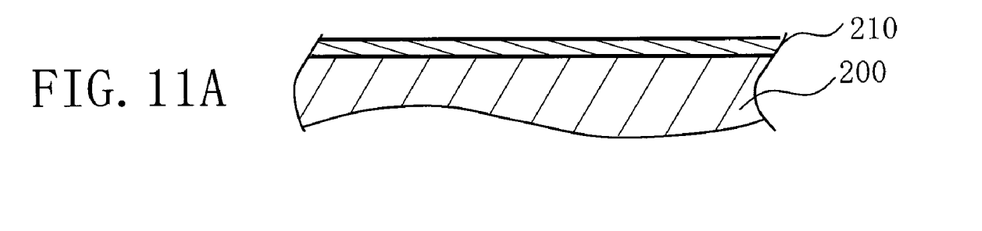
FIG. 11A and FIG. 11B are process sectional views showing processes performed corresponding to the flow chart in FIG. 10.
Figure 11B:
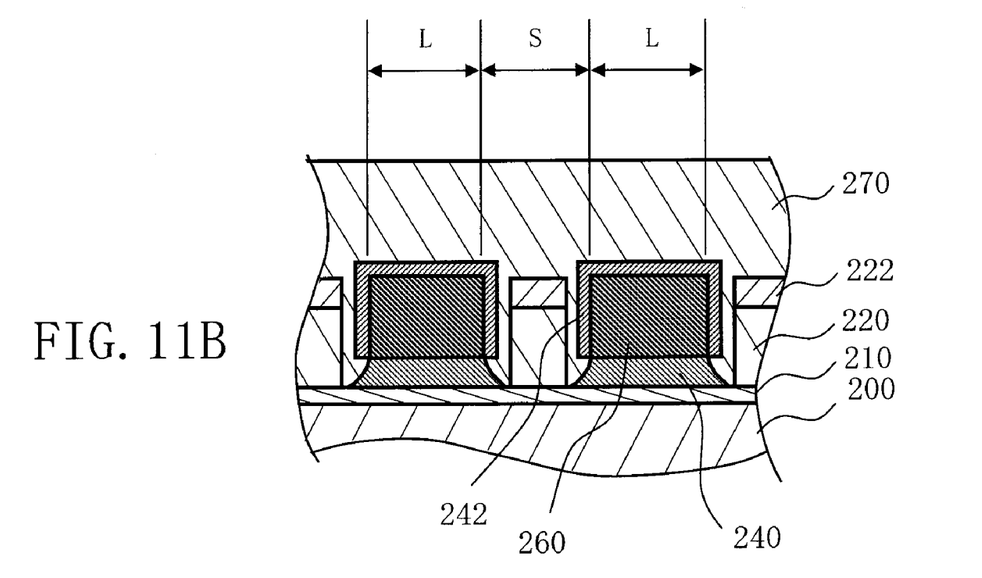

FIG. 11A and FIG. 11B are process sectional views showing processes performed corresponding to the flow chart in FIG. 10. FIG. 11A and FIG. 11B show the diffusion prevention film formation process (S101) to the low-k film formation process (S120) in FIG. 10.

In FIG. 11A, as the diffusion prevention film formation process (S101), a diffusion prevention film 210 is formed on the surface of the substrate 200 using the CVD method. As a material of the diffusion prevention film 210, for example, SiC, SiN, SiCN, porous SiCN, or a laminated film of these may be used. Then, the low-k film formation process (S102) in which the low-k film 220 is formed on the diffusion prevention film 210 to the low-k film formation process (S120) are performed in the same manner as in the first embodiment. Here in the opening formation process (S106), the diffusion prevention film 210 is treated as an etching stopper by the anisotropic method when the opening 150 is formed inside the SiOC film 222 and the low-k film 220 in the lithography and dry etching processes.

By performing each process in FIG. 10 as described above, as shown in FIG. 11B, a semiconductor device in which the diffusion prevention film 210 is arranged between the catalytic characteristic film 240 and the substrate 200 can be formed. Accordingly, barrier properties at the bottom of the Cu film 260 can further be enhanced compared with a case of the catalytic characteristic film 240 only.

According to each embodiment described above, a conductive material film is embedded on a catalytic characteristic film having high wettability and therefore, the conductive material film can still be embedded in a more microscopic opening. Thus, the wire width can be made still finer.

In the above description, a similar effect can be achieved using materials used in the semiconductor industry and having Cu as a main component such as a Cu—Sn alloy, a Cu—Ti alloy, and a Cu—Al alloy, in addition to Cu, as wiring layer materials in each of the above embodiments.

Embodiments of the invention have been described above with reference to concrete examples. However, the invention is not limited to these concrete examples. In the configurations of the second to fifth embodiments, for example, the diffusion prevention film 210 shown in the sixth embodiment may suitably be arranged because diffusion of Cu to the substrate 200 can be prevented. As an example, instead of the diffusion prevention film 242, the diffusion prevention film 243 shown in the second and fourth embodiments may be used in a configuration in which the diffusion prevention film 210 is arranged between the substrate 200 and the catalytic characteristic film 240. As another example, the low-k film 272 may be formed by leaving behind a space on the side of sidewalls of the Cu film 260, as shown in the third and fourth embodiments, in a configuration in which the diffusion prevention film 210 is arranged between the substrate 200 and the catalytic characteristic film 240. As still another example, the diffusion prevention film 224 may be formed on the Cu film 260 and the SiOC film 222 by omitting formation of a diffusion prevention film on the sidewalls of the Cu film 260 and leaving behind a space on the side of sidewalls of the Cu film 260, as shown in the fifth embodiment, in a configuration in which the diffusion prevention film 210 is arranged between the substrate 200 and the catalytic characteristic film 240.

Further, the thickness of inter-level dielectric, the size, shape, and number of openings and the like may be used by selecting what is needed for semiconductor integrated circuits and various semiconductor devices as needed.

In addition, all semiconductor devices and manufacturing methods of semiconductor devices having elements of the invention and whose design can be modified as needed by those skilled in the art are included in the scope of the invention.

Though techniques normally used in the semiconductor industry, for example, a lithography process and cleaning before and after treatment are omitted for simplification of the description, these techniques are naturally included in the scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for fabricating a semiconductor device, comprising:
    forming a first dielectric film above a substrate;
    forming an opening in the first dielectric film;
    forming a catalytic characteristic film using at least one of a metal having catalytic characteristics and a conductive oxide having catalytic characteristics as its material on sidewalls and at a bottom of the opening;
    depositing a conductive material film using a conductive material in the opening in which the catalytic characteristic film is formed on the sidewalls and at the bottom;
    removing the catalytic characteristic film formed on the sidewalls of the opening; and
    forming a second dielectric film above the first dielectric film and the conductive material film after the removing.

2. The method according to claim 1, wherein the second dielectric film is formed by leaving behind a space on a side of the sidewalls of the conductive material film.

3. The method according to claim 1, wherein a ruthenium (Ru) film is used as the catalytic characteristic film.

4. The method according to claim 1, further comprising forming a diffusion prevention film, whose thickness is thinner than that of the catalytic characteristic film, on the sidewalls and an upper surface of the conductive material film after the catalytic characteristic film being removed and before the second dielectric film being formed.

5. The method according to claim 4, wherein the diffusion prevention film is selectively formed on the sidewalls and the upper surface of the conductive material film.

6. The method according to claim 2, wherein the second dielectric film is formed also in a space from which the catalytic characteristic film has been removed.

7. The method according to claim 5, wherein a compound film of copper (Cu), silicon (Si), and nitrogen (N) is used as the diffusion prevention film.

8. The method according to claim 5, wherein a cobalt (Co) alloy film is used as the diffusion prevention film.

9. The method according to claim 8, wherein the Co alloy film is formed by electroless plating.

10. The method according to claim 8, wherein a cobalt-tungsten-boron (CoWB) film or cobalt-tungsten-phosphor (CoWP) film is used as the Co alloy film.

11. The method according to claim 1, wherein an alloy film of a first metal having catalytic characteristics and a second metal having higher barrier property than the first metal is used as the catalytic characteristic film.

12. The method according to claim 11, wherein an alloy film of ruthenium (Ru) and tantalum (Ta), titanium (Ti), or tungsten (W) is used as the catalytic characteristic film.

13. A method for fabricating a semiconductor device, comprising:
    forming a diffusion prevention film above a substrate;
    forming a first dielectric film above the diffusion prevention film;
    forming an opening in the first dielectric film;
    forming a catalytic characteristic film using at least one of a metal having catalytic characteristics and a conductive oxide having catalytic characteristics as its material on sidewalls and at a bottom of the opening;
    depositing a conductive material film using a conductive material in the opening in which the catalytic characteristic film is formed on the sidewalls and at the bottom;
    removing the catalytic characteristic film formed on the sidewalls of the opening; and
    forming a second dielectric film above the first dielectric film and the conductive material film after the removing.

14. The method according to claim 13, wherein the second dielectric film is formed also in a space from which the catalytic characteristic film has been removed.

15. The method according to claim 13, wherein the opening is formed by using the diffusion prevention film as a stopper.

16. The method according to claim 13, further comprising forming another diffusion prevention film, whose thickness is thinner than that of the catalytic characteristic film, on the sidewalls and an upper surface of the conductive material film after the catalytic characteristic film being removed and before the second dielectric film being formed.

17. The method according to claim 16, wherein the another diffusion prevention film is selectively formed on the sidewalls and the upper surface of the conductive material film.

18. The method according to claim 17, wherein a compound film of copper (Cu), silicon (Si), and nitrogen (N) is used as the another diffusion prevention film.

19. The method according to claim 17, wherein a cobalt (Co) alloy film is used as the another diffusion prevention film.

20. The method according to claim 19, wherein a cobalt-tungsten-boron (CoWB) film or cobalt-tungsten-phosphor (CoWP) film is used as the Co alloy film.

* * * * *